(12) United States Patent
Wei et al.

(10) Patent No.: US 11,107,949 B2
(45) Date of Patent: Aug. 31, 2021

(54) LED DISPLAY DEVICE, METHOD FOR MANUFACTURING THE SAME, AND LED DISPLAY PANEL

(71) Applicant: CHENGDU VISTAR OPTOELECTRONICS CO., LTD., Sichuan (CN)

(72) Inventors: Dong Wei, Kunshan Suzhou (CN); Xiaolong Yang, Kunshan Suzhou (CN); Jiantai Wang, Kunshan Suzhou (CN); Huashan Chen, Kunshan Suzhou (CN); Rubo Xing, Kunshan Suzhou (CN)

(73) Assignee: CHENGDU VISTAR OPTOELECTRONICS CO., LTD., Chengdu (CN)

( * ) Notice: Subject to any disclaimer, the term of this patent is extended or adjusted under 35 U.S.C. 154(b) by 1 day.

(21) Appl. No.: 16/804,476

(22) Filed: Feb. 28, 2020

(65) Prior Publication Data
US 2020/0203563 A1 Jun. 25, 2020

Related U.S. Application Data

(63) Continuation of application No. PCT/CN2019/084870, filed on Apr. 28, 2019.

(30) Foreign Application Priority Data

Aug. 31, 2018 (CN) .......................... 201811013940.9

(51) Int. Cl.
*H01L 33/06* (2010.01)
*G06F 1/16* (2006.01)
(Continued)

(52) U.S. Cl.
CPC ............ *H01L 33/06* (2013.01); *G06F 1/1652* (2013.01); *G09G 3/32* (2013.01); *H01L 25/0753* (2013.01);
(Continued)

(58) Field of Classification Search
CPC combination set(s) only.
See application file for complete search history.

(56) References Cited

U.S. PATENT DOCUMENTS

2010/0237287 A1* 9/2010 Kuze .................. C09K 11/7734
252/301.4 F
2017/0287887 A1* 10/2017 Takeya ................. H01L 25/167
(Continued)

FOREIGN PATENT DOCUMENTS

CN 106252528 A 12/2016
CN 107068707 A 8/2017
(Continued)

*Primary Examiner* — Ratisha Mehta
(74) *Attorney, Agent, or Firm* — Maier & Maier, PLLC

(57) ABSTRACT

A light emitting diode (LED) display device includes a plurality of pixel units. Each of the plurality of pixel units includes a red subpixel, a green subpixel, and a blue subpixel. The red subpixel is arranged with a first LED chip, the green subpixel is arranged with a second LED chip, and the blue subpixel is arranged with a third LED chip. The first LED chip is a blue LED chip or a green LED chip. The second LED chip is the green LED chip. The third LED chip is the blue LED chip. The red subpixel is further arranged with a red light conversion block arranged on the first LED chip.

20 Claims, 4 Drawing Sheets

(51) Int. Cl.
  *G09G 3/32*     (2016.01)
  *H01L 25/075*   (2006.01)
  *H01L 33/32*    (2010.01)
  *H01L 33/50*    (2010.01)
  *H01L 33/52*    (2010.01)

(52) U.S. Cl.
  CPC ............ *H01L 33/32* (2013.01); *H01L 33/504* (2013.01); *H01L 33/52* (2013.01); *H01L 2933/0033* (2013.01); *H01L 2933/0041* (2013.01)

(56) References Cited

U.S. PATENT DOCUMENTS

| | | | |
|---|---|---|---|
| 2018/0074372 A1* | 3/2018 | Takeya | G02F 1/133602 |
| 2018/0292711 A1* | 10/2018 | Yoon | G02F 1/133617 |
| 2019/0114974 A1* | 4/2019 | Chen | G02F 1/133514 |
| 2019/0244937 A1* | 8/2019 | Honjo | G09F 9/00 |
| 2020/0285097 A1* | 9/2020 | Zhang | G02B 6/0088 |

FOREIGN PATENT DOCUMENTS

| | | |
|---|---|---|
| CN | 107390430 A | 11/2017 |
| CN | 206947335 U | 1/2018 |
| CN | 108291141 A | 7/2018 |
| JP | WO2012173037 A1 | 12/2012 |

* cited by examiner

LED DISPLAY DEVICE, METHOD FOR MANUFACTURING THE SAME, AND LED DISPLAY PANEL

CROSS-REFERENCE TO RELATED APPLICATIONS

The present application is a continuation-application of international (PCT) Patent Application No. PCT/CN20191/084870 filed on Apr. 28, 2019, which claims the foreign priority of Chinese Patent Application No. 201811013940.9, filed on Aug. 31, 2018 in the National Intellectual Property Administration of China, the entire contents of which are hereby incorporated by reference in their entireties.

TECHNICAL FIELD

The present disclosure relates to the field of display technology, and in particular to a light emitting diode (LED) display device, a method for manufacturing the LED display device, and an LED display panel.

BACKGROUND

Currently, a display panel, using a light emitting diode (LED) as a light emitting pixel, has been broadly utilized in the field of display. Referring to FIG. 1, each pixel unit of a micro-sized LED display panel 10 may include a red subpixel R, a green subpixel G and a blue subpixel B arranged sequentially on a substrate 110. Color conversion of each subpixel may be achieved via a blue LED chip of each subpixel. To be specific, the red subpixel R is arranged with the blue LED chip 111 and a quantum dot (QD) pattern layer 112, and the QD pattern layer 112 is arranged on the blue LED chip 111. The QD pattern layer 112 may be irradiated and excited by a blue light emitted from the blue LED chip 111 to emit a red light, such that the color conversion into the red light may be achieved. Similarly, the green subpixel G is arranged with a blue LED chip 121 and a QD pattern layer 122, and the QD pattern layer 122 is arranged on the blue LED chip 121. The QD pattern layer 122 may be irradiated and excited by a blue light emitted from the blue LED chip 121 to emit a green light, such that the color conversion into the green light may be achieved. The blue LED chip 131 may be arranged with the blue subpixel B and may emit a blue light directly.

In the related art, ink jet printing (IJP) may be typically performed to form the QD pattern layer 112 on the blue LED chip 111 arranged with the red subpixel R and form the QD pattern layer 122 on the blue LED chip 121 arranged with the green subpixel G.

During the IJP to form the QD pattern layer, a shape of a QD liquid drop jetted from a nozzle may be variable. A plurality of tiny liquid drops may be distributed around a major liquid drop. Scattered tiny liquid drops may deviate from a predefined position and may be distributed into a region of an adjacent subpixel. Therefore, manufacturing the QD pattern layers 112 and 122 (i.e., the QD may need to be patterned for a plurality of times) may be difficult, and printing accuracy of the IJP may be restricted.

Further, as technology advances, a market's demand for a high pixel density may be increased. The high pixel density may result in a size of each pixel of the LED display panel to reduce. As the printing accuracy of the IJP may be restricted, color conversion of the blue LED chip with the high pixel density may be difficult to be achieved.

SUMMARY OF THE DISCLOSURE

The present disclosure may provide an LED display device, a method for manufacturing the LED display device, and an LED display panel, wherein difficulty of QD patterning may be reduced, and color conversion of the blue LED chip with a higher pixel density may be achieved.

According to a first aspect of the present disclosure, a light emitting diode (LED) display device may be provided and include a plurality of pixel units. Each of the plurality of pixel units may include a red subpixel, a green subpixel, and a blue subpixel. The red subpixel may be arranged with a first LED chip, the green subpixel may be arranged with a second LED chip, and the blue subpixel may be arranged with a third LED chip. The first LED chip may be a blue LED chip or a green LED chip, the second LED chip may be the green LED chip, and the third LED chip may be the blue LED chip. The red subpixel may further be arranged with a red light conversion block arranged on the first LED chip.

In some embodiments, the green LED chip may include a gallium nitride-based LED chip.

In some embodiments, a material of the gallium nitride-based LED chip may include indium gallium nitride.

In some embodiments, the red light conversion block may include a quantum dot (QD) light conversion material.

In some embodiments, the red subpixel further may include an adhesion layer, arranged between the red light conversion block and the first LED chip.

In some embodiments, a sealing material may be arranged on the second LED chip and the third LED chip. The sealing material may further be arranged to seal the red light conversion block, and the sealing material and the red light conversion block may form a seal layer cooperatively.

In some embodiments, a surface of the seal layer facing towards the first LED chip, the second LED chip, and the third LED chip may be arranged with an adhesion layer.

In some embodiments, the seal layer may be formed on a plate, and may be arranged between the plate and the first LED chip, between the plate and the second LED chip, and between the plate and the third LED chip. The first LED chip, the second LED chip, and the third LED chip may be arranged on a substrate. A periphery of the plate may be arranged with an adhesion layer, and the plate may be adhered with the substrate at the periphery.

In some embodiments, the adhesion layer may be a layer of glue.

In some embodiments, the substrate may be a glass substrate, a plastic substrate, or a flexible substrate.

According to a second aspect of the present disclosure, an LED display panel may be provided and include a driving circuit and a LED display device. The LED display device may include a plurality of pixel units. Each of the plurality of pixel units may include a red subpixel, a green subpixel, and a blue subpixel. The red subpixel may be arranged with a first LED chip, the green subpixel may be arranged with a second LED chip, and the blue subpixel may be arranged with a third LED chip. The first LED chip may be a blue LED chip or a green LED chip. The second LED chip may be the green LED chip. The third LED chip may be the blue LED chip. The red subpixel may further be arranged with a red light conversion block arranged on the first LED chip. The driving circuit may be electrically coupled with the first LED chip, the second LED chip, and the third LED chip.

In some embodiments, the green LED chip may include a gallium nitride-based LED chip.

In some embodiments, the red light conversion block may include a quantum dot (QD) light conversion material.

In some embodiments, the LED display panel may be a flexible display panel.

According to a third aspect of the present disclosure, a method for manufacturing a LED display device may be provided and include operations of: providing a substrate, including a first region at which a red subpixel is formed, a second region at which a green subpixel is formed, and a third region at which a blue subpixel is formed; arranging a first LED chip, a second LED chip, and a third LED chip in the first region, the second region, and the third region, respectively; and arranging a red light conversion block on the first LED chip in the first region. The first LED chip may be a blue LED chip or a green LED chip, the second LED chip may be the green LED chip, and the third LED chip may be the blue LED chip.

In some embodiments, the green LED chip may include a gallium nitride-based LED chip.

In some embodiments, the arranging the red light conversion block on the first LED chip in the first region may include operations of: arranging a masking plate having a plurality of hollow regions above a layer of the first LED chip, the second LED chip, and the third LED chip, enabling each of the plurality of hollow regions to align with each first LED chip vertically, such that each first LED chip extending into each hollow region; performing ink jet printing (IJP) to allow red light quantum dot (QD) ink to pass through the plurality of hollow regions to deposit on the first LED chip in the first region; and drying the red light QD ink to form the red light conversion block.

In some embodiments, the arranging the red light conversion block on the first LED chip in the first region may include operations of: arranging a masking plate having a plurality of hollow regions on a transfer medium; performing IJP to allow red light QD ink to pass through the plurality of hollow regions to deposit on the transfer medium; drying the red light QD ink to form the red light conversion block; forming an adhesion layer on a top surface of the red light conversion block; and adhering the red light conversion block with the first LED chip in the first region correspondingly via the adhesion layer.

In some embodiments, the first LED chip may be the blue LED chip. Mass transfer may be performed to simultaneously transfer the first LED chip and the third LED into the first region and the third region, respectively, and subsequently transfer the second LED chip into the second region.

In some embodiments, the first LED chip may be the green LED chip. Mass transfer may be performed to transfer the third LED chip into the third region firstly, and transfer the second LED chip and the first LED chip simultaneously into the second region and the first region respectively.

According to the present disclosure, an LED display panel, an LED display device, and a method for manufacturing the LED display device are provided to reduce a difficulty of QD patterning and to achieve color conversion of the blue LED chip with a higher pixel density.

DETAILED DESCRIPTION

Technical solutions of embodiments of the present disclosure may be described clearly and comprehensively by referring to drawings of the embodiments. It may be understood that, specific embodiments of the description may be for the purposes of illustrating the present disclosure, but not to limit the present disclosure. Without confliction, various embodiments and features appeared in the various embodiments may be combined. Further to be noted that, to provide an easy description, the drawings may illustrate partial structures related to the present disclosure, but not all structures. According to the embodiments of the present disclosure, any other embodiment obtained by any one of skill in the art without creative work shall be within the scope of the present disclosure.

Figure 2:
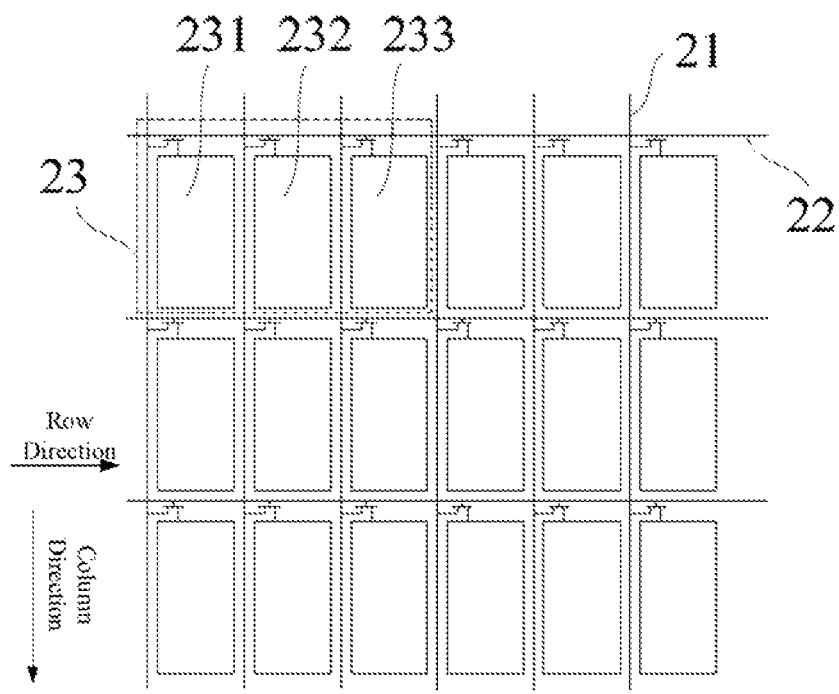
FIG. 2 is a structural view of a part of pixels of an LED display panel according to an embodiment of the present disclosure.

FIG. 2 is a structural view of a part of pixels of a light emitting diode (LED) display panel according to an embodiment of the present disclosure. As shown in FIG. 2, the LED display panel may include a plurality of data lines 21 extending along a column direction, a plurality of scanning lines 22 extending along a row direction, and a plurality of pixel units 23 defined by the plurality of scanning lines 22 and the plurality of data lines 21. The plurality of pixel units 23 may be arranged in an array.

Each pixel unit 23 may include a red subpixel 231, a green subpixel 232, and a blue subpixel 233, arranged sequentially.

According to the present disclosure, the red subpixel 231, the green subpixel 232, and the blue subpixel 233 may be arranged with a first LED chip, a second LED chip, and a third LED chip, respectively. The first LED chip may be a blue LED chip or a green LED chip. The second LED chip may be the green LED chip. The third LED chip may be the blue LED chip. In addition, the red subpixel 231 may further be arranged with a red light conversion block, and the red light conversion block may be arranged on the first LED chip. In other words, at least two situations may be available.

In a first situation, the blue subpixel 233 may be arranged with the blue LED chip, the green subpixel 232 may be arranged with the green LED chip, and the red subpixel 231 may be arranged with the blue LED chip and a light conversion block, wherein the light conversion block may be arranged on the blue LED chip of the red subpixel 231, and the light conversion block may be a red light conversion block.

In a second situation, the blue subpixel 233 may be arranged with the blue LED chip, the green subpixel 232 may be arranged with the green LED chip, and the red subpixel 231 may be arranged with the green LED chip and a light conversion block, wherein the light conversion block may be arranged on the green LED chip of the red subpixel 231, and the light conversion block may be the red light conversion block.

The above-mentioned LED chips (including the blue LED chip) may be a Micro-LED, and the LED display panel may be a Micro-LED display panel. The blue LED chip may be arranged to emit a blue light, and the green LED chip may be arranged to emit a green light.

Figure 3:
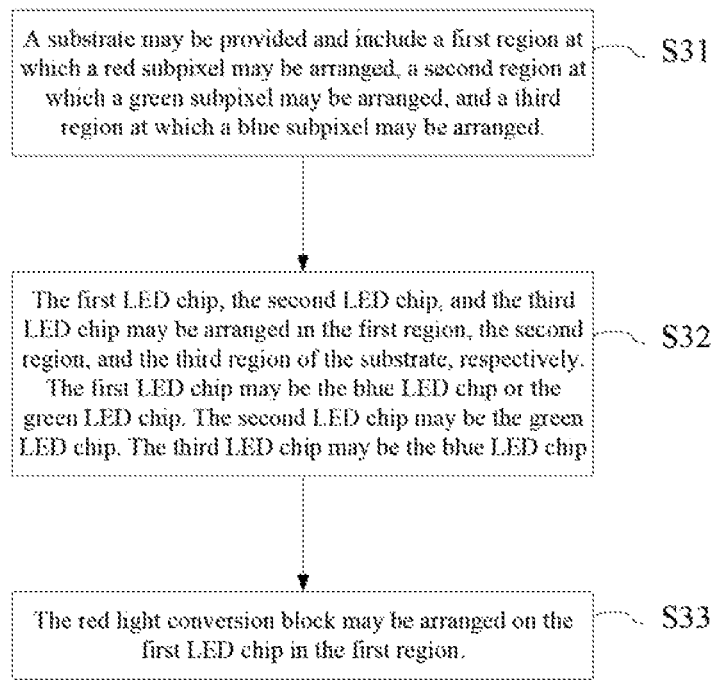
FIG. 3 is a flow chart of a method for manufacturing an LED display device according to a first embodiment of the present disclosure.

The method as shown in FIG. 3 may be performed to manufacture an LED display device of the LED display panel having the above-mentioned structures. As shown in FIG. 3, the method of manufacturing the LED display device may include operations of S31 to S33.

At S31, a substrate may be provided and include a first region at which the red subpixel may be arranged, a second region at which the green subpixel may be arranged, and a third region at which the blue subpixel may be arranged.

At S32, the first LED chip, the second LED chip, and the third LED chip may be arranged in the first region, the second region, and the third region of the substrate, respectively. The first LED chip may be the blue LED chip or the green LED chip. The second LED chip may be the green LED chip. The third LED chip may be the blue LED chip.

At S33, the red light conversion block may be arranged on the first LED chip in the first region.

Figure 4:
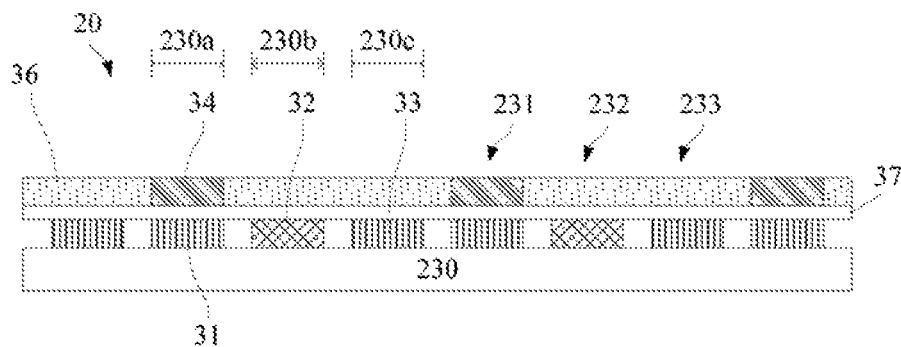
FIG. 4 is a structural view of a subpixel according a first embodiment of an LED display device of the LED display panel shown in FIG. 2.

FIG. 4 is a structural view of a subpixel according a first embodiment of an LED display device of the LED display panel shown in FIG. 2. Referring to FIG. 2 and FIG. 4, each pixel unit 23 may include the red subpixel 231, the green subpixel 232, and the blue subpixel 233 arranged on the substrate 230 sequentially. The blue subpixel 233 may be arranged with the blue LED chip 33 (i.e., the above-mentioned third LED chip), the green subpixel 232 may be arranged with the green LED chip 32 (i.e., the above-mentioned second LED chip), the red subpixel 231 may be arranged with the blue LED chip 31 (i.e., the above-mentioned first LED chip) and the light conversion block 34 arranged on the blue LED chip 31. The light conversion block 34 may be the red light conversion block, and may be arranged to convert the blue light emitted from the blue LED chip 31 into a red light.

Figure 1:
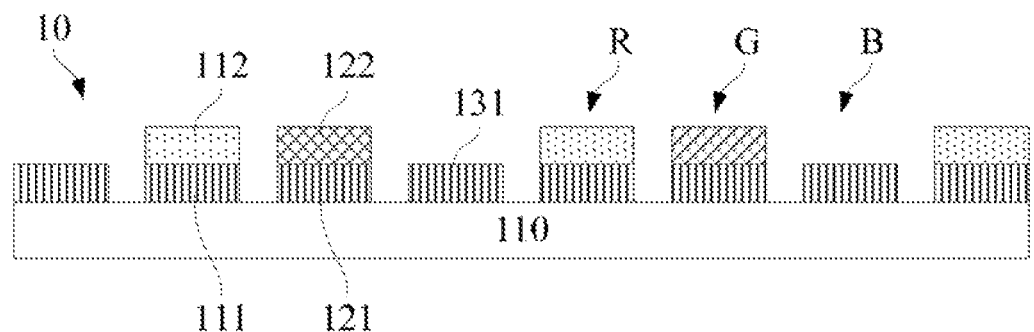
FIG. 1 is a cross sectional view of a partial structure of an LED display panel in the related art.

Compared to the LED display panel as shown in FIG. 1, the present implementation may omit a green light conversion block, and that is, a quantum dot (QD) pattern layer 122 shown in FIG. 1 may be omitted, such that manufacture of the LED display panel may be simplified and may not be limited by printing accuracy of an ink jet printing (IJP) technology, wherein the IJP may be performed to form the green light conversion block, and therefore, color conversion of the light emitted by blue LED chip with a high pixel density may be achieved.

As a QD may have a high luminous efficiency, and may maintain light stability even after a plurality of times of excitation and light emitting, the red light conversion block 34 may be the QD pattern layer having a red light QD. A material of the red light QD may include, but may not be limited to, at least one of CdSe, CdS, ZnS, ZnSe, $CuInS_2$, InS, $CH_3PbCl_3$, $CH_3PbBr_3$, $CH_3PbI_3$, $CsPbCl_3$, $CsPbBr_3$, and $CsPbI_3$.

Under situation of the red light conversion block 34 being a QD light conversion block (equivalent to the QD pattern layer in the related art), compared to the related art shown in FIG. 1, the present disclosure may include only one process of patterning the red light QD and omit a process of patterning a green light QD, and thus reducing the difficulty of QD patterning.

The green LED chip 32 may be arranged to emit the green light, and may be a GaN-based LED chip, for example, indium gallium nitride may be included. Similarly, at least one of the blue LED chip 31 and the blue LED chip 33 may also be the GaN-based LED chip. Therefore, the present disclosure may achieve a completely GaN-based colorization display.

Further referring to FIG. 4, the red subpixel 231 may further include an adhesion layer 37 arranged between the red light conversion block 34 and the blue LED chip 31. In the present embodiment, the adhesion layer 37 may be arranged on a side of a seal layer 36 facing towards the blue LED chip 31. The seal layer 36 may be arranged to seal the red light conversion block 34 to allow the red light conversion block 34 to isolate from water and oxides, and therefore, the adhesion layer 37 may be arranged to adhere the seal layer 36 (the red light conversion block 34 sealed by the seal layer 36 may be included) with the green LED chip 32 and the blue LED chip 33. The adhesion layer 37, such as glue, may have high transparency, and especially, the blue light may have high transmissibility through the adhesion layer 37.

Figure 5:
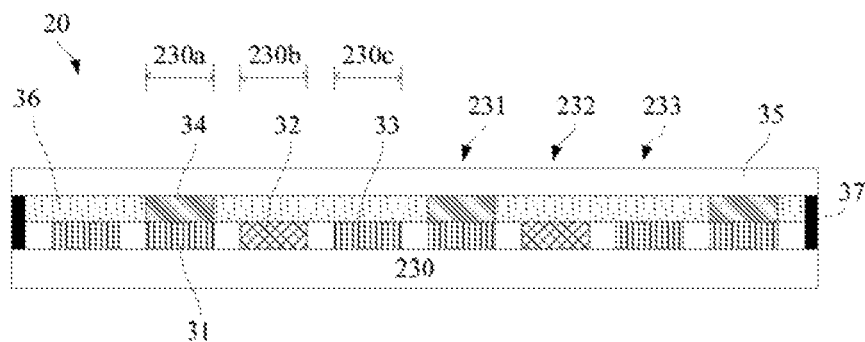
FIG. 5 is a structural view of a subpixel according a second embodiment of an LED display device of the LED display panel shown in FIG. 2.

FIG. 5 is a structural view of a subpixel according a second embodiment of an LED display device of the LED display panel shown in FIG. 2. To provide an easy description, the present disclosure may use a same reference number for a same element. The red light conversion block 34 may be directly arranged on the blue LED chip 31. To be specific, in the present disclosure, the blue LED chip 31 may be sealed, and the IJP may be performed to allow red light QD ink to deposit on the sealed blue LED chip 31. The red light QD ink may be dried to form the red light conversion block 34. The dried red light conversion block 34 may be sealed by the seal layer 36. Alternatively, the red light conversion block 34 may be formed on a plate 35. For example, the IJP may be performed to allow the QD ink to pass through a hollow region to deposit on the plate 35, and the QD ink may be dried to form the red light conversion block 34. Further, a periphery of the plate 35, which carries the red light conversion block 34, may be coated by the adhesion layer 37, such as the glue. The plate 35 may be flipped to stack with the substrate 230, such that the plate 35 and the substrate 230 may be adhered with each other at the periphery. Under such a situation, the adhesion layer 37 may not be arranged between the red light conversion block 34 and the blue LED chip 31.

Figure 6:
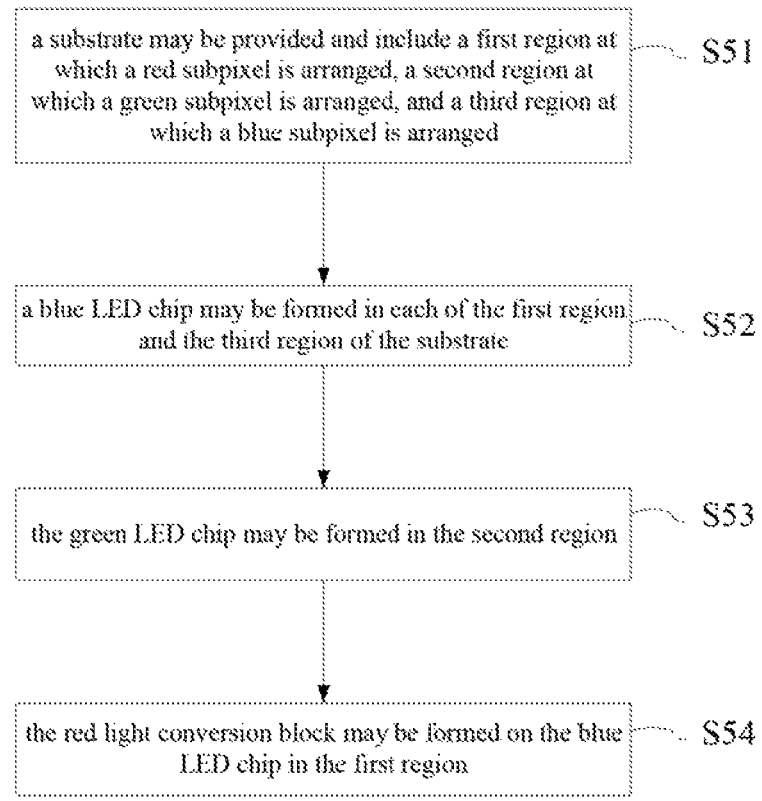
FIG. 6 is a flow chart of a method for manufacturing an LED display device according to a second embodiment of the present disclosure.

FIG. 6 is a flow chart of a method for manufacturing an LED display device according to a second embodiment of the present disclosure. The method may be performed to manufacture an LED display device 20 having a subpixel structure as shown in FIG. 4. As shown in FIG. 6, the method in the present embodiment may include operations of S51-S54.

At S51, a substrate may be provided and include a first region at which a red subpixel is arranged, a second region at which a green subpixel is arranged, and a third region at which a blue subpixel is arranged.

Referring to FIG. 4, the substrate 230 may be a glass substrate, a plastic substrate, or a flexible substrate. Under a situation of manufacturing a flexible LED display device 20, the substrate 230 may be the flexible substrate, such as a polyimide (PI) substrate. It may be understood that, the substrate 230 may further be arranged with a driving circuit to drive each LED chip to emit light, a welding point, and the like. Therefore, the substrate 230 may be regarded as a driving substrate.

The substrate 230 may include a first region 230a, a second region 230b, and a third region 230c arranged sequentially. The first region 230a may be a red subpixel region, the second region 230b may be a green subpixel region, and the third region 230c may be a blue subpixel region.

At S52, a blue LED chip may be formed in each of the first region and the third region of the substrate.

As shown in FIG. 4, the blue LED chip 31 may be formed in the first region 230a at which the red subpixel 231 is arranged, and the blue LED chip 33 may be formed in the third region 230c at which the blue subpixel 233 is arranged. The term "formed" may indicate that each of the blue LED chips 31 and 33 may be welded to connect with the welding point on the substrate 230, such that the blue LED chips 31 and 33 may be electrically coupled with the driving circuit.

At S53, the green LED chip may be formed in the second region.

The green LED chip 32 may be welded to connect with the welding point in the second region 230b of the substrate 230, such that the green LED chip may be electrically coupled with the driving circuit.

In order to meet a demand of the LED display device 20 having a high pixel density, in the present disclosure, mass transfer may be performed to simultaneously transfer the blue LED chips 31 and 33 onto the substrate 230, and the green LED chip 32 may subsequently be transferred into the second region 230b of the substrate 230. To be specific, the substrate 230 may define a plurality of first regions 230a, a plurality of second regions 230b, and a plurality of third regions 230c. A massive amount of blue LED chips may be arranged on a transfer plate. An arrangement of the massive amount of blue LED chips may be the same as an arrangement of red subpixels 231 and blue subpixels 233. The massive amount of blue LED chips may be welded into the plurality of first regions 230a and the plurality of third regions 230c of the substrate 230 by performing a predefined engineering technology.

Alternatively, in the present disclosure, the green LED chip 32 may be transferred into the second region 230b of the substrate 230 via the mass transfer, and subsequently, the blue LED chips 31 and 33 may be transferred onto the substrate 230 simultaneously via the mass transfer.

At S54, the red light conversion block may be formed on the blue LED chip in the first region.

Figure 7:
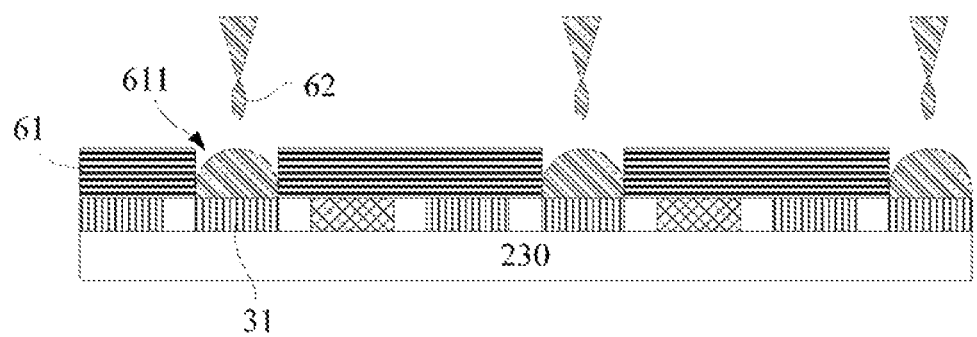
FIG. 7 is a scene of forming a red light conversion block according to an embodiment by following the flow chart shown in FIG. 6.

The red light conversion block 34 being the QD pattern layer having the red light QD may be taken as an example. Referring to FIG. 7, in an embodiment, a masking plate 61 having a plurality of hollow regions 611 may be arranged above a layer of the sealed blue LED chip 31, the green LED chip 32, and the blue LED chip 33, enabling each of the plurality of hollow regions 611 to align with each blue LED chip 31 vertically, such that the blue LED chip 31 may extend into the hollow region 611. The IJP may be performed to allow the QD ink 62 to pass through each hollow region 611 to deposit on the blue LED chip 31. The QD ink 62 may be dried to form the red light conversion block 34. Further, the red light conversion block 34 may be sealed by the seal layer 36.

Figure 8:
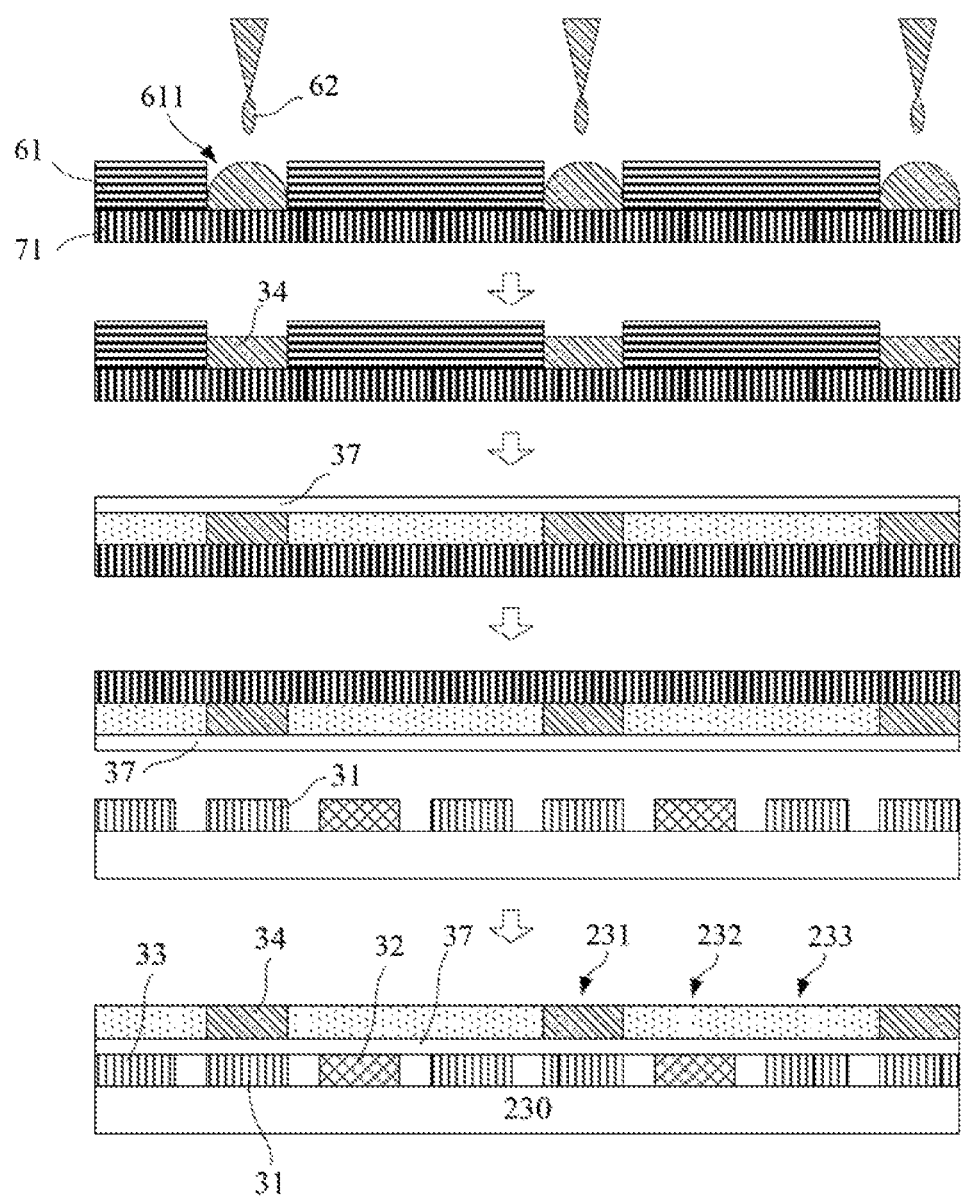
FIG. 8 is a scene of forming a red light conversion block according to another embodiment by following the flow chart shown in FIG. 6.

In another embodiment, as shown in FIG. 8, at S54, the masking plate 61 having the plurality of hollow regions 611 may be arranged on a transfer medium 71. The transfer medium 71 may be a thin film. The IJP may be performed to allow the QD ink 62 to pass through the plurality of hollow regions 611 to deposit on a surface of the transfer medium 71. The QD ink 62 may be dried to form the red light conversion block 34, and the red light conversion block 34 may be sealed. The masking plate 61 may be removed, and the adhesion layer 37, such as glue, may be coated on a top surface of the red light conversion block 34. The transfer medium 71 may be flipped, such that the top surface of the red light conversion block 34 may adhere to the blue LED chip 31 in the first region 230a correspondingly via the adhesion layer 37. The transfer medium 71 may be removed eventually, and the LED display device as shown in FIG. 4 may be obtained.

Figure 9:
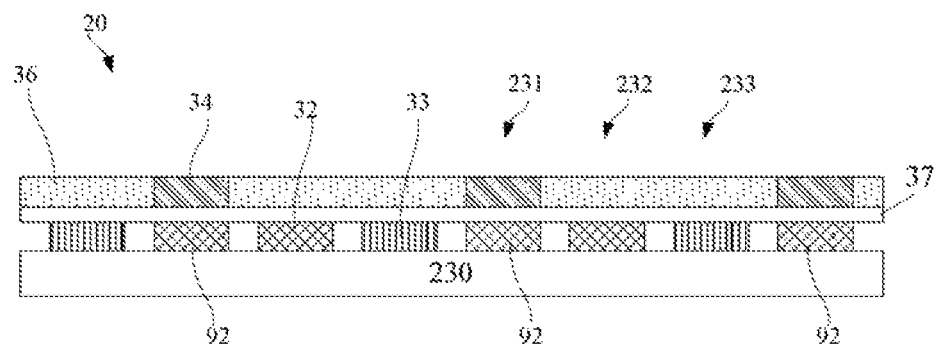
FIG. 9 is a structural view of a subpixel according a third embodiment of an LED display device of the LED display panel shown in FIG. 2.

FIG. 9 is a structural view of a subpixel according a third embodiment of an LED display device of the LED display panel shown in FIG. 2. As shown in FIG. 2 and FIG. 9, on the basis of but different from the above-mentioned embodiments, as an LED display device 20 in the present embodiment, the red subpixel 231 may be arranged with the green LED chip 92, and the red light conversion block 34 may be arranged on the green LED chip 92. The green light emitted from the green LED chip 92 may irradiate the red light conversion block 34, and the red light QD in the red light conversion block 34 may be excited to emit the red light.

In the present disclosure, the LED display panel shown in FIG. 2 may be the LED display device 20 according to the embodiments shown in FIG. 4 and FIG. 5, or may be the LED display device 20 according to the embodiment shown in FIG. 9. The LED display panel and the LED display devices may exhibit similar effects.

It may be understood that, terms of "first", "second", and "third" are for the purposes of description only, but not to indicate or implicit significance of each element or the number of the described feature. Therefore, the feature defined by the "first", "second", and "third" may indicate or implicit at least one of the mentioned features are arranged. The term "a plurality of" may indicate at least two, such as two, three, and more, unless otherwise clearly and specifically defined. Any directional indication in the embodiments of the present disclosure (such as top, bottom, left, right, front, back, and the like) may be used to explain a relative position relation between each element and a moving status of each element when the embodiment is in a particular pose (as shown in the figure). When the particular pose is changed, the directional indication may be changed accordingly.

Further, the above description may be embodiments of the present disclosure only, but not to limit the scope of the present disclosure. Any equivalent structural or process transformation based on the specification or the drawings of the present disclosure, such as a combination of technical features of various embodiments, applied directly or indirectly in other related art shall be within the scope of the present disclosure.

What is claimed is:

1. A light emitting diode display device, comprising a plurality of pixel units, each of the plurality of pixel units comprising a red subpixel, a green subpixel, and a blue subpixel wherein the red subpixel is arranged with a first light emitting diode chip, the green subpixel is arranged with a second light emitting diode chip, and the blue subpixel is arranged with a third light emitting diode chip;

the plurality of pixel units comprise a plurality of first light emitting diode chips, a plurality of second light emitting diode chips and a plurality of third light emitting diode chips, and a seal layer is arranged on the plurality of first light emitting diode chips, the plurality of second light emitting diode chips and the plurality of third light emitting diode chips;

the first light emitting diode chip is a blue light emitting diode chip or a green light emitting diode chip;

the second light emitting diode chip is the green light emitting diode chip;

the third light emitting diode chip is the blue light emitting diode chip; and the red subpixel is further arranged with a red light conversion block arranged on the first light emitting diode chip, the seal layer comprises a sealing material and a plurality of red light conversion blocks, and the sealing material comprises a plurality of separated sealing portions, and each of the red light conversion blocks is arranged between every two separated sealing portions;

each of the red light conversion blocks is arranged on each of the first light emitting diode chips respectively, and the sealing portions are arranged on the second light emitting diode chips and the third light emitting diode chips respectively.

2. The light emitting diode display device of claim 1, wherein the green light emitting diode chip comprises a gallium nitride-based light emitting diode chip.

3. The light emitting diode display device of claim 2, wherein a material of the gallium nitride-based light emitting diode chip comprises indium gallium nitride.

4. The light emitting diode display device of claim 1, wherein the red light conversion block comprises a quantum dot light conversion material.

5. The light emitting diode display device of claim 1, wherein the red subpixel further comprises an adhesion layer arranged between the red light conversion block and the first light emitting diode chip.

6. The light emitting diode display device of claim 1, further comprising an adhesion layer provided on a surface of the seal layer facing towards to first light emitting diode chip, the second light emitting diode chip, and the third light emitting diode chip.

7. The light emitting diode display device of claim 1, wherein the seal layer is formed on a plate and is arranged between the plate and the first light emitting diode chip, between the plate and the second light emitting diode chip, and between the plate and the third light emitting diode chip;

the first light emitting diode chip, the second light emitting diode chip, and the third light emitting diode chip are arranged on a substrate; and a periphery of the plate is arranged with an adhesion layer, and the plate is adhered with the substrate at the periphery.

8. The light emitting diode display device of claim 7, wherein the adhesion layer is a layer of glue.

9. The light emitting diode display device of claim 7, wherein the substrate is a glass substrate, a plastic substrate, or a flexible substrate.

10. The light emitting diode display device of claim 1, wherein an upper surface of the red light conversion block arranged between the two separated sealing portions is in the same horizontal plane as respective upper surfaces of the two separated sealing portions, and a lower surface of the red light conversion block arranged between the two separated sealing portions is in the same horizontal plane as respective lower surfaces of the two separated sealing portions.

11. A light emitting diode display panel, comprising a driving circuit and a light emitting diode display device, wherein the light emitting diode display device comprises a plurality of pixel units, each of the plurality of pixel units comprises a red subpixel, a green subpixel, and a blue subpixel;

the red subpixel is arranged with a first light emitting diode chip, the green subpixel is arranged with a second light emitting diode chip, and a blue subpixel is arranged with a third light emitting diode chip;

the plurality of pixel units comprise a plurality of first light emitting diode chips, a plurality of second light emitting diode chips and a plurality of third light emitting diode chips, and a seal layer is arranged on the plurality of first light emitting diode chips, the plurality of second light emitting diode chips and the plurality of third light emitting diode chips;

the first light emitting diode chip is a blue light emitting diode chip or a green light emitting diode chip;

the second light emitting diode chip is the green light emitting diode chip;

the third light emitting diode chip is the blue light emitting diode chip;

the red subpixel is further arranged with a red light conversion block arranged on the first light emitting diode chip;

the seal layer comprises a sealing material and a plurality of red light conversion blocks, and the sealing material comprises a plurality of separated sealing portions, and each of the red light conversion blocks is arranged between every two separated sealing portions;

each of the red light conversion blocks is arranged on each of the first light emitting diode chips respectively, and the sealing portions are arranged on the second light emitting diode chips and the third light emitting diode chips respectively; and the driving circuit is electrically coupled with the first light emitting diode chip, the second light emitting diode chip, and the third light emitting diode chip.

12. The light emitting diode display panel of claim 11, wherein the green light emitting diode chip comprises a gallium nitride-based light emitting diode chip.

13. The light emitting diode display panel of claim 11, wherein the red light conversion block comprises a quantum dot light conversion material.

14. The light emitting diode display panel of claim 11, wherein the light emitting diode display panel is a flexible display panel.

15. A method for manufacturing a light emitting diode display device, comprising:

providing a substrate, the substrate comprising a first region at which a red subpixel is formed, a second region at which a green subpixel is formed, and a third region at which a blue subpixel is formed;

arranging a first light emitting diode chip, a second light emitting diode chip, and a third light emitting diode chip in the first region, the second region, and the third region, respectively, wherein the light emitting diode chip is a blue light emitting diode chip or a green light emitting diode chip, the second light emitting diode chip is the green light emitting diode chip, and the third light emitting diode chip is the blue light emitting diode chip;

arranging a red light conversion block on the first light emitting diode chip in the first region;

arranging a sealing material on the second light emitting diode chip and the third light emitting diode chip, wherein the sealing material comprises at least two separated sealing portions, and the red light conversion block is arranged between every two separated sealing portions, the at least two separated sealing portions are arranged on the second light emitting diode chip and the third light emitting diode chip.

16. The method of claim 15, wherein the green light emitting diode chip comprises a gallium nitride-based light emitting diode chip.

17. The method of claim 15, wherein the arranging a red light conversion block on the first light emitting diode chip in the first region comprises:

arranging a masking plate having a plurality of hollow regions above a layer of the first light emitting diode chip, the second light emitting diode chip, and the third light emitting diode chip, enabling each of the plurality of hollow regions to align with each first light emitting diode chip vertically, such that each first light emitting diode chip is arranged to extend into each hollow region;

performing ink jet printing to allow red light quantum dot ink to pass through the plurality of hollow regions to deposit on the first light emitting diode chip in the first region; and drying the red light quantum dot ink to form the red light conversion block.

18. The method of claim 15, wherein the arranging a red light conversion block on the first light emitting diode chip in the first region comprises:

arranging a masking plate having a plurality of hollow regions on a transfer medium;

performing ink jet printing to allow red light quantum dot ink to pass through the plurality of hollow regions to deposit on the transfer medium;

drying the red light quantum dot ink to form the red light conversion block;

forming an adhesion layer on a top surface of the red light conversion block; and adhering the red light conversion block with the first light emitting diode chip in the first region correspondingly via the adhesion layer.

19. The method of claim 15, wherein the first light emitting diode chip is the blue light emitting diode chip; and mass transfer is performed to simultaneously transfer the first light emitting diode chip and the third light emitting diode chip into the first region and the third region, respectively, and subsequently transfer the second light emitting diode chip into the second region.

20. The method of claim 15, wherein the first light emitting diode chip is the green light emitting diode chip; and mass transfer is performed to transfer the third light emitting diode chip into the third region, and transfer simultaneously the second light emitting diode chip and the first light emitting diode chip into the second region and the first region, respectively.

* * * * *